(12) United States Patent
Tuominen et al.

(10) Patent No.: US 8,547,701 B2
(45) Date of Patent: Oct. 1, 2013

(54) ELECTRONICS MODULE AND METHOD FOR MANUFACTURING THE SAME

(75) Inventors: Risto Tuominen, Helsinki (FI); Antti Iihola, Helsinki (FI)

(73) Assignee: Imbera Electronics Oy, Espoo (FI)

( * ) Notice: Subject to any disclaimer, the term of this patent is extended or adjusted under 35 U.S.C. 154(b) by 200 days.

(21) Appl. No.: 11/791,547

(22) PCT Filed: Nov. 24, 2005

(86) PCT No.: PCT/FI2005/000506
§ 371 (c)(1),
(2), (4) Date: Sep. 28, 2007

(87) PCT Pub. No.: WO2006/056648
PCT Pub. Date: Jun. 1, 2006

(65) Prior Publication Data
US 2008/0094805 A1    Apr. 24, 2008

(30) Foreign Application Priority Data
Nov. 26, 2004    (FI) .................................... 20041525

(51) Int. Cl.
*H05K 7/00*    (2006.01)

(52) U.S. Cl.
USPC ........... 361/728; 361/715; 361/768; 361/773; 361/779; 257/686; 257/690; 257/782; 174/250; 174/255; 174/256; 174/260; 174/261; 174/262; 174/265; 174/524; 29/846; 29/852; 438/106; 438/612; 438/616; 428/209; 428/344

(58) Field of Classification Search
USPC ......... 361/728, 715, 768, 773, 779; 257/686, 257/690, 782; 174/250, 255, 256, 260–262, 174/524, 265; 29/846, 852; 438/106, 455, 438/612, 616; 428/209, 344

See application file for complete search history.

(56) References Cited

U.S. PATENT DOCUMENTS 4,752,499 A * 6/1988 Enomoto .................... 427/97.2
4,783,695 A   11/1988 Eichelberger et al.
(Continued)

FOREIGN PATENT DOCUMENTS

EP    0 465 196 A2    7/1991
EP    0 574 207 A2    6/1993
(Continued)

*Primary Examiner* — Xiaoliang Chen
(74) *Attorney, Agent, or Firm* — Birch, Stewart, Kolasch & Birch, LLP

(57) ABSTRACT

This publication discloses an electronics module and a method for manufacturing it. The electronic module includes at least one first embedded component (6), the contact terminals (7) of which face essentially towards the first surface of the insulating-material layer (1) and which is connected electrically by its contact terminals (7) to the conductor structures contained in the electronic module. According to the invention, a second embedded component (6'), the contact terminals (7') of which face essentially towards the second surface of the insulating-material layer and which is connected electrically by its contact terminals (7') to the conductor structures contained in the electronic module, is attached by means of glue or two-sided tape to the first component (6), and the contact terminals (7, 7') are connected to the conductor structures with the aid of a conductive material, which is arranged in the insulating-material layer in holes (17) at the locations of the contact terminals (7, 7'). By means of the invention, it is possible to achieve a simple module construction comprising two component layers, which permits the manufacture of smaller electronic devices than previously.

21 Claims, 6 Drawing Sheets

(56) References Cited

U.S. PATENT DOCUMENTS

Figure 1:
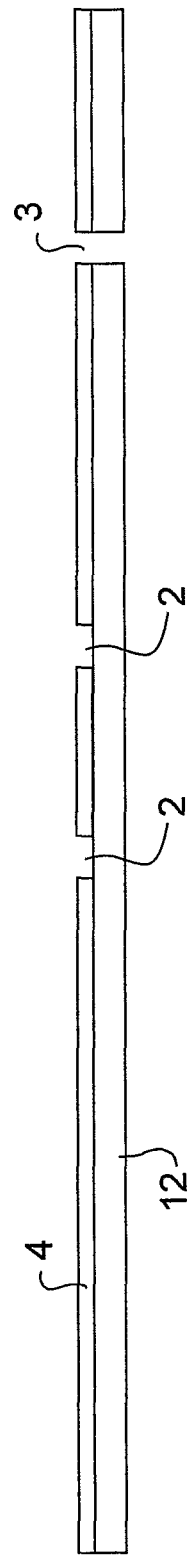

| | | | |
|---|---|---|---|
| 4,918,811 A | 4/1990 | Eichelberger et al. | |
| 5,014,114 A * | 5/1991 | Heckaman et al. | 257/707 |
| 5,038,251 A * | 8/1991 | Sugiyama et al. | 235/61 R |
| 5,048,179 A | 9/1991 | Shindo et al. | |
| 5,356,698 A * | 10/1994 | Kawamoto et al. | 428/209 |
| 5,426,263 A | 6/1995 | Potter et al. | |
| 5,593,606 A * | 1/1997 | Owen et al. | 219/121.71 |
| 5,703,400 A | 12/1997 | Wojnarowski et al. | |
| 5,707,730 A * | 1/1998 | Oishi et al. | 428/344 |
| 5,870,289 A * | 2/1999 | Tokuda et al. | 361/779 |
| 5,874,784 A * | 2/1999 | Aoki et al. | 257/787 |
| 6,007,920 A * | 12/1999 | Umehara et al. | 428/473.5 |
| 6,020,059 A * | 2/2000 | Yamada et al. | 428/328 |
| 6,037,661 A * | 3/2000 | Palagonia et al. | 257/723 |
| 6,064,112 A * | 5/2000 | Iwaya et al. | 257/673 |
| 6,097,081 A * | 8/2000 | Masuda et al. | 257/666 |
| 6,156,484 A | 12/2000 | Bassous et al. | 430/313 |
| 6,159,767 A * | 12/2000 | Eichelberger | 438/107 |
| 6,252,010 B1 | 6/2001 | Takeuchi et al. | 525/403 |
| 6,309,912 B1 | 10/2001 | Chiou et al. | |
| 6,343,019 B1 | 1/2002 | Jiang et al. | |
| 6,376,769 B1 * | 4/2002 | Chung | 174/524 |
| 6,406,990 B1 * | 6/2002 | Kawai | 438/612 |
| 6,410,415 B1 * | 6/2002 | Estes et al. | 438/612 |
| 6,414,385 B1 * | 7/2002 | Huang et al. | 257/690 |
| 6,426,880 B1 * | 7/2002 | Chen | 361/773 |
| 6,429,114 B1 * | 8/2002 | Hayama et al. | 438/616 |
| 6,444,922 B1 * | 9/2002 | Kwong | 174/261 |
| 6,462,148 B1 * | 10/2002 | Suzuki et al. | 525/534 |
| 6,538,209 B1 * | 3/2003 | Ouchi et al. | 174/256 |
| 6,545,366 B2 * | 4/2003 | Michii et al. | 257/777 |
| 6,569,491 B1 * | 5/2003 | Courduvelis | 205/126 |
| 6,573,584 B1 * | 6/2003 | Nagakari et al. | 257/528 |
| 6,576,869 B1 * | 6/2003 | Gower et al. | 219/121.71 |
| 6,674,159 B1 * | 1/2004 | Peterson et al. | 257/680 |
| 6,724,074 B2 * | 4/2004 | Song et al. | 257/676 |
| 6,744,121 B2 * | 6/2004 | Chang et al. | 257/668 |
| 6,779,262 B1 * | 8/2004 | Gales et al. | 29/852 |
| 6,783,654 B2 * | 8/2004 | Inoue et al. | 205/292 |
| 6,806,559 B2 * | 10/2004 | Gann et al. | 257/672 |
| 6,828,510 B1 * | 12/2004 | Asai et al. | 174/255 |
| 6,841,884 B2 * | 1/2005 | Shizuno | 257/777 |
| 6,847,105 B2 * | 1/2005 | Koopmans | 257/686 |
| 6,881,318 B2 * | 4/2005 | Hey et al. | 205/87 |
| 6,885,106 B1 * | 4/2005 | Damberg et al. | 257/777 |
| 6,921,860 B2 * | 7/2005 | Peterson et al. | 174/523 |
| 6,977,190 B2 * | 12/2005 | Yamaguchi | 438/107 |
| 7,050,303 B2 * | 5/2006 | Park et al. | 361/715 |
| 7,070,670 B2 * | 7/2006 | Tomiyama et al. | 156/248 |
| 7,148,080 B2 * | 12/2006 | Kim et al. | 438/106 |
| 7,148,081 B2 * | 12/2006 | Higashino et al. | 438/106 |
| 7,190,071 B2 * | 3/2007 | Shin et al. | 257/734 |
| 7,230,188 B1 * | 6/2007 | En et al. | 174/257 |
| 7,258,918 B2 * | 8/2007 | Tsukagoshi et al. | 428/355 EP |
| 7,312,400 B2 * | 12/2007 | Ito et al. | 174/250 |
| 7,318,729 B2 * | 1/2008 | Sato et al. | 439/66 |
| 7,355,287 B2 * | 4/2008 | Chung | 257/780 |
| 2001/0030059 A1 | 10/2001 | Sugaya et al. | |
| 2002/0020898 A1 | 2/2002 | Vu et al. | |
| 2002/0036546 A1 * | 3/2002 | Hatanaka et al. | 331/68 |
| 2002/0137263 A1 | 9/2002 | Towle et al. | |
| 2003/0015342 A1 | 1/2003 | Sakamoto et al. | |
| 2003/0134451 A1 * | 7/2003 | Chen | 438/109 |
| 2003/0136577 A1 * | 7/2003 | Abe | 174/255 |
| 2003/0141105 A1 | 7/2003 | Sugaya et al. | |
| 2003/0168254 A1 * | 9/2003 | Kariya et al. | 174/261 |
| 2003/0227095 A1 * | 12/2003 | Fujisawa et al. | 257/782 |
| 2004/0070064 A1 * | 4/2004 | Yamane et al. | 257/686 |
| 2004/0070083 A1 * | 4/2004 | Su | 257/778 |
| 2004/0145040 A1 * | 7/2004 | Fukuda et al. | 257/687 |
| 2004/0145044 A1 | 7/2004 | Sugaya et al. | |
| 2004/0178492 A1 * | 9/2004 | Tsukamoto et al. | 257/690 |
| 2004/0206943 A1 * | 10/2004 | Saito et al. | 252/500 |
| 2005/0006142 A1 * | 1/2005 | Ishimaru et al. | 174/262 |
| 2005/0016768 A1 * | 1/2005 | Zollo et al. | 174/262 |
| 2005/0029645 A1 * | 2/2005 | Mess et al. | 257/686 |
| 2005/0059217 A1 * | 3/2005 | Morrow et al. | 438/455 |
| 2005/0060886 A1 * | 3/2005 | Tsukahara et al. | 29/846 |
| 2005/0077025 A1 * | 4/2005 | Mattix | 174/265 |
| 2005/0098869 A1 * | 5/2005 | Shiozawa | 257/686 |
| 2005/0163966 A1 * | 7/2005 | Chengalva et al. | 428/131 |
| 2005/0287829 A1 * | 12/2005 | Ichikawa | 439/66 |

FOREIGN PATENT DOCUMENTS

| | | |
|---|---|---|
| EP | 1 111 674 A2 | 6/2001 |
| EP | 1 225 629 A2 | 7/2002 |
| EP | 1 259 103 A1 | 11/2002 |
| EP | 1 321 980 A1 | 6/2003 |
| JP | 2001-189403 A | 7/2001 |
| WO | WO-01/63991 A1 | 8/2001 |
| WO | WO-02/27782 A2 | 4/2002 |
| WO | WO-02/33751 A2 | 4/2002 |

* cited by examiner

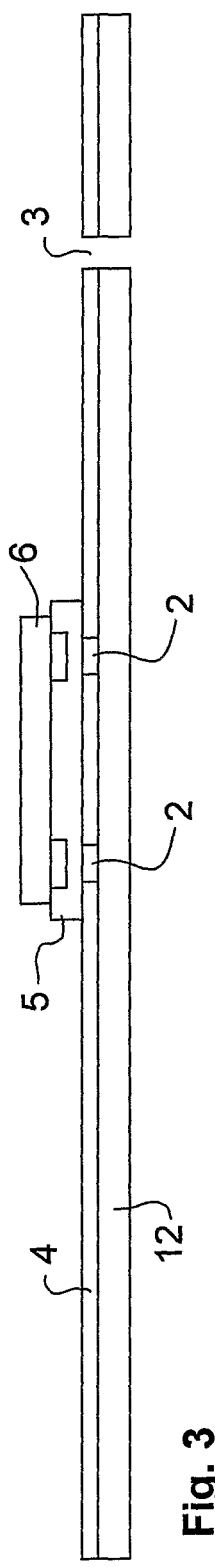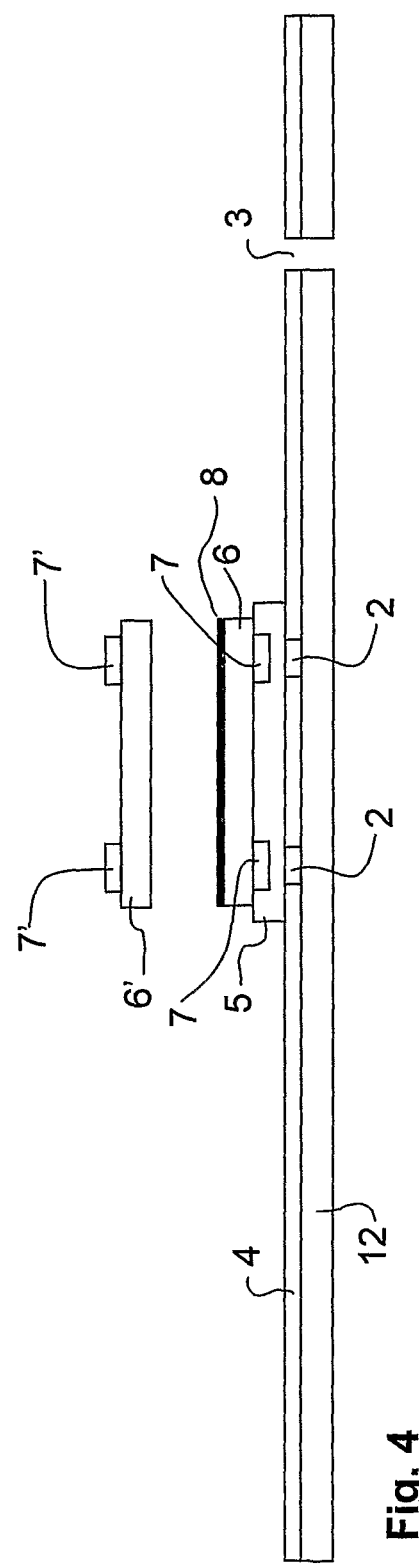

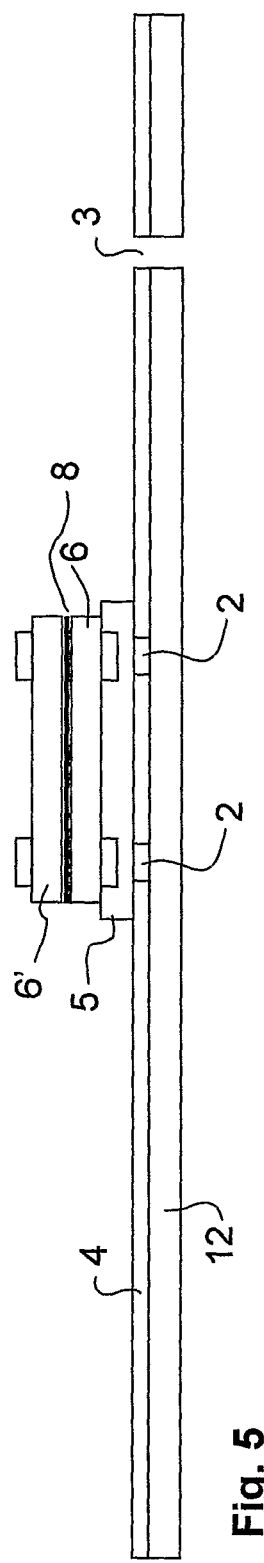
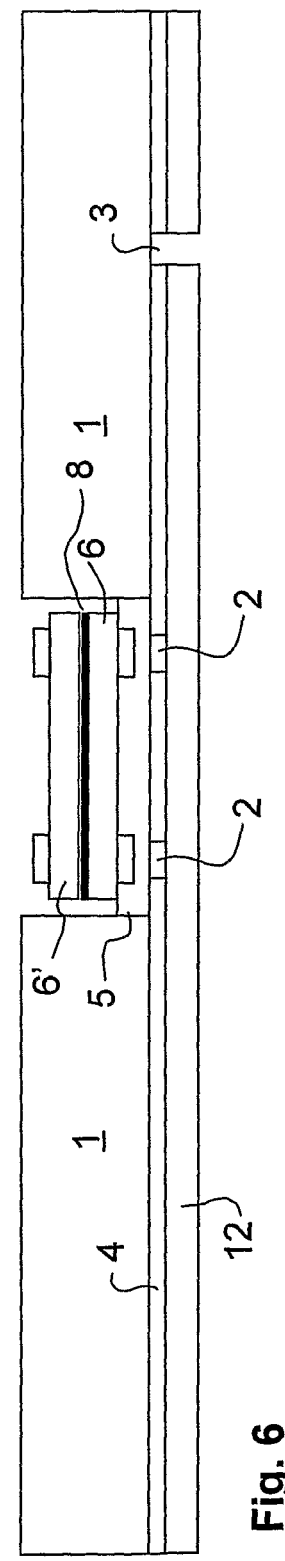

ELECTRONICS MODULE AND METHOD FOR MANUFACTURING THE SAME

The present invention relates to an electronics module which contains embedded components.

An electronics module of this kind can be a module like a circuit board, the components contained by which are connected to each other electrically through conductor structures made in the electronic module. The invention particularly relates to an electronic module, which contains microcircuits, to which several contact terminals are connected. In addition to, or instead of the microcircuits other components, for example, passive components, can also be embedded in the installation base of the electronic module.

In addition, the invention relates to a method for manufacturing such an electronics module.

Traditionally, in the electronics industry components are attached to the surface of a circuit board either by through-assembly or by surface joints. In these cases, the components remain on the surface of the electronics product and are subject to the conditions surrounding it, for example, humidity and mechanical stress. This has made it necessary to encase the components, which seeks to protect the component and facilitate its handling. On the surface of the case of the component there are connector parts, typically protrusions, with the aid of which the encased component can be easily set correctly on the circuit board and the desired connections formed to it. In addition, inside the component case there are leads, which connect the connection parts protruding outside the case the contact areas on the surface of the actual component, and through which the component can be connected as desired to its surroundings.

The cases of components manufactured by the traditional technology demand, however, a considerable amount of space while the encased components protrude considerably from the surface of the circuit board. As the size of electronic components has diminished, attempts have been made to eliminate the component cases, which take up space, are unnecessary, and lead to unneeded costs. In order to solve this problem, attempts have been made to develop various constructions and methods, which will allow components to be located inside the circuit-board structure. Thus, they aim to create an electronic module, in which components, which are typically encased for connection to a circuit board, are embedded uncased. Another significant group of components are those that are typically attached uncased to the circuit board (to the surface of the circuit board).

Known methods, in which components are embedded an installation base during the creation of the base, are disclosed in patent application publications WO 03/065778 and WO 03/065779, as well as in patent publications U.S. Pat. No. 6,038,133 and U.S. Pat. No. 6,489,685. With the aid of the methods disclosed in the publications, it is possible to manufacture, for example, multilayer circuit boards, inside which integrated microcircuits, for example microprocessors and memory circuits, are embedded.

Said publications disclose different methods for manufacturing a circuit board, in which the contact terminals of the embedded components are connected to the conductor structures and contact surfaces of only one surface of the base. To save space, it is preferable if the components can be attached directly to both surfaces of the circuit board, which can be used to create electrical connections between the components and extending outside the circuit board. This, however, requires a more complex module construction and a more demanding manufacturing method.

Patent publication U.S. Pat. No. 6,292,366 discloses a circuit board, which includes a rigid layer, which is made from two aluminium sheets on top of each other. Recesses are made in both sheets for attaching the microcircuits, by means of a layer that reduces mechanical stress and conducts heat, to both sides of the rigid layer. This construction permits the microcircuits to be set in two layers and connected directly on both sides of the metal sheet acting as an installation base. A channel running parallel to the sheets is made between the sheets to conduct heat away from the microcircuits. On top of the rigid layer, on both sides of the sheet, there are two layers comprising contact surfaces and microvias, to which the microcircuits are connected electrically. In the construction according to the said publication, there are thus, including the thermal channel layer remaining between the components, the layers reducing mechanical stress, and the layers conducting heat, eleven separate layers, due to which the structure becomes thicker and its manufacture unavoidably becomes complicated.

U.S. Pat. No. 5,426,263 discloses a circuit board, in which two components can be set back-to-back, in such a way that their contact bumps can be connected to the conductor-structure boards lying against them by soldering. During soldering the conductor-structure boards must be ready-patterned on the connection side, because the solder joints will remain hidden in the internal layer and beneath the components. The conductor-structure sheets are attached to each other using an insulating-material layer, which surrounds the embedded components laterally.

US publication U.S. Pat. No. 6,343,019 discloses a circuit board, in which two components can be attached to each other and embedded in the circuit board. In the solution disclosed, wire-bonding is used to attach the components to the conductor layers of the circuit board. Particularly in the case of the second, upper component, several wires must be pulled through the holes made for the component and the hole filled with an adhesive. In the case of small components this is extremely difficult in terms of manufacturing technique and there is a risk that the wires will come in electrical contact with each other. The same problem also relates to the solution disclosed in JP publication 2001/189403. Also in it, the upper component is connected to the conductor structures of the circuit board by using wires located in the recess made for the components and running at least partly parallel to the circuit board.

U.S. Pat. No. 5,703,400 discloses a construction similar to that above, in which the insulating material of the circuit board also remains between the components. In this solution, the components are, however, attached to flexible polymer layers, which are located on both sides of the insulating-material layer. The polymer layers contain metallized conductor structures. The aim is a flexible circuit board, in which the components bend relative to each other.

US application publication 2004/0145044 discloses a circuit board, which can contain components set opposite to each other, which are electrically connected to different surfaces of the circuit board. The components are pressed into the insulating material of the circuit board with the aid of pressure and heat, so that the insulating material (the so-called buffer layer) of the circuit board remains between them. This increases the thickness of the product and also prevents the transfer of heat between the components.

The invention is intended to make possible an electronic-module construction comprising two component layers, which will be simpler compared to the prior art.

The invention is based on the idea of Joining the components together in such a way that their contact terminals can be connected to either the upper or lower surface of the base board. This takes place by bringing the component, the contact terminals of which face essentially towards the upper surface of the base board, on top of a component glued to the base, the contact terminals of which face essentially towards the lower surface of the board. This is preferably done before the insulating material forming most of the base and the conductor layer forming the upper surface of the base are brought on top of the conductor layer forming the lower surface of the base.

The components set opposite to each other can be of the same or different sizes and they can be, for example, glued to each other. The insulating layer is brought to the base, for example, after gluing. Holes at the positions of the contact terminals of the components are made through the conductor layers arranged on top of the insulator layer, as far as the level of the surface of the contact terminals of the components, and additional conductive material is put into these holes to connect the components electrically to the conductor layers. In the final stage, the desired circuit pattern is formed on both sides of the conductor layers, for example, by etching.

More specifically, the electronic module according to the invention is characterized by what is stated in claim 19.

The manufacturing method of the electronic module according to the invention is, in turn, characterized by what is stated in claim 31.

Considerable advantages are gained with the aid of the invention. In the electronic module according to it, the components that are set opposite to each other are embedded attached to each other in the same insulating-material layer, so that the module can be made thin and its manufacturing process can be simplified. Because, in addition, more components can be made to fit into each unit of surface area compared to a situation in which the components are connected to only one side of the board, the size of electronic devices can be reduced.

The board according to the invention can be made without wire bonds, which increases the reliability of the manufacturing technique and simplifies the manufacturing process considerably. In addition, attaching the components to each other permits them to be brought to the manufacturing base already before the insulating-material layer is brought to it. In addition, it ensures that the components will remain in alignment for the entire duration of the manufacturing process.

In addition, the via technique that is described generally above and later in greater detail permits the patterning of the conductor layers to be left until the final manufacturing stage, i.e. when both conductor layers have been arranged on the opposite surfaces of the insulating-material layer. In other words, patterning can be performed after the components have been connected electrically to the conductor layers. This would be impossible if the embedded components are connected to the conductor structures using a surface-soldering technique, for example.

Other advantages of the invention are described later in connection with the various embodiments of the invention.

Heretofore and hereinafter the term 'hole' can refer not only to a hole that extends through the structure, but also to a recess, which is created, for example, by drilling or with the effect of a laser, and which need not extend through the structure (the base or some other layer) in question.

The components' contact terminals can be, for example, protrusions, such as bumps, or other kinds, for example, flat contact areas, on the surface of the component. Within the scope of the present application, the contact terminal faces towards a specific direction, if it can be approached from this direction in such a way that an electrical contact can be made with it, for example, using the method disclosed in the present application. The term contacting surface of the component, on the other hand, refers to a component surface that includes contact terminals, or in the direction of the surface of which the contact terminals of the component can be approached in order to create an electrical contact.

The term upper surface refers to one surface of the module, module blank, or component while the term lower surface refers to the opposite surface to this. Generally, the terms "upper" and "lower" refer to the directions according to the appended figures, or which are apparent from them. In the following, the invention is examined with the aid of examples and with reference to the appended drawings.

FIGS. 1-12 show a series of cross-sections of some examples of the application of the invention, in connection with one manufacturing method.

Stage A (FIG. 1)

In stage A, a suitable conductor layer 4 is selected as the starting material for the process. A layered sheet, in which the conductor layer 4 is located on the surface of a support base 12, can also be selected as the starting material. The layered sheet can be manufactured, for example, by taking a support base 12 suitable for processing and attaching a suitable conductor membrane to the surface of this support base 12, for the creation of a conductor layer 4.

The support base 12 can be, for example, of an electrically conductive material, such as aluminium (Al), or of an insulating material, such as a polymer. The conductor layer 4 can be created, for example by attaching thin metal foil to one surface of the support base 12, for example, by laminating it from copper (Cu). The metal foil can be attached to the support base, for example, by using an adhesive layer, which is spread on the surface of the support base 12 or metal foil, prior to the lamination of the metal layer. At this stage, there is no need for any patterns in the metal foil.

In the example of FIG. 1, holes 3, which penetrate the support base 12 and the conductor layer 4, are made in the base, for alignment during the installation and connection of the components 6 (hereinafter, also 'the first component'). The through-holes 3 can be referred to as alignment holes and two of them, for example, can be manufactured for each component 6 to be installed. The holes 3 can be made using some suitable method, for example, mechanically by milling, stamping, drilling, or with the aid of a laser. However, making of the through-holes 3 in not necessary, instead other suitable alignment markings can also be used to align the components. In the embodiment shown in FIG. 1, the through-holes 3 used to align the components extend through both the support base 12 and the conductor film 4. This has the advantage that the same alignment marks (through-holes 3) can be used for aligning on both sides of the installation base.

In stage A in a preferred embodiment, contacting holes 2 are also manufactured in the conductor layer 4 for the components 6, at the positions of the contact terminals 7 of the components 6. The holes 2 can extend through the conductor layer 4, or be recesses on that side of the conductor layer, to which the components 6 will be glued at a later stage. If the contacting holes are made in the conductor layer 4 already at this stage, there is no danger that the drilling will damage the components. For example, when using laser drilling, a tolerance of about 5 µm is associated with drilling at typical drilling depths. When proceeding in this way, it is either possible to avoid making contacting holes entirely, or at least make it easier to create contacts to this side of the base at a later manufacturing stage. Stage A can also be performed in the same way in embodiments, in which a self-supporting conductor layer 4 is used and which thus entirely lack the support layer 12.

Figure 2:
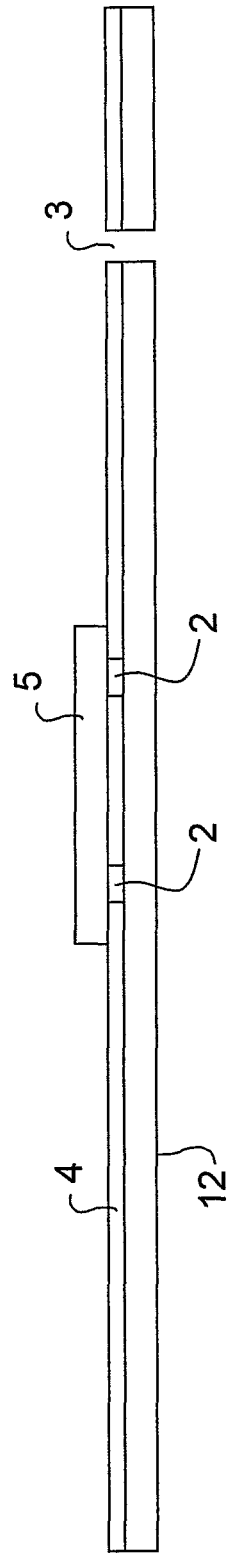

Stage B (FIG. 2)

In stage B, an adhesive layer 5 is spread on the conductor layer 4, in the areas to which the components 6 are to be mounted. These areas can be termed connection areas. The adhesive layers 5 can be aligned, for example, with the aid of through-holes 3 or contacting holes 2. The thickness of the adhesive layer is selected in such a way that the adhesive completely fills the space between the component 6 and the conductor layer 4, when the component 6 is pressed onto the adhesive layer 5. If the component 6 includes contact protrusions 7, the thickness of the adhesive layer 5 should be greater, for example, 1.5-10 times, than the height of the contact protrusions 7, so that the space between the component 6 and the conductor layer 4 will be well filled. The surface area of the adhesive layer 5 formed for the component 6 can also be slightly greater than the surface area corresponding to the component 6, which will also help to reduce the risk of inadequate filling.

The adhesive used in the embodiments is typically a heat-cured epoxy, for example, NCA (non conductive adhesive). The adhesive is selected such that it ensures that the adhesive will adhere sufficiently to the conductor membrane, the circuit-board, and the component. One preferred property of the adhesive is a suitable thermal expansion coefficient, so that during the process the thermal expansion of the adhesive will not differ excessively from the thermal expansion of the surrounding material. The adhesive selected should also preferably have a short curing time of at most a few seconds. Within this time, the adhesive should harden at least partly to an extent that will allow the adhesive to hold the component in place. The final hardening can take a clearly longer time and indeed the final curing can be planned to occur in connection with the later process stages. The adhesive should also withstand the process temperatures used, for example, heating to a temperature of 100-265° C. a few times, as well as other stresses, for example, chemical and mechanical stress, in the manufacturing process. The electrical conductivity of the adhesive should preferably be of the same order as that of the insulating materials.

Stage B can be modified in such a way that the adhesive layer 5 is spread on the connector surfaces of the components 6, instead of on the connector areas of the conductor layer 4. This can be performed, for example, in such a way that the component is dipped in adhesive before it is assembled in place in the electronic module. It is also possible to proceed by spreading the adhesive on both the connector areas of the conductor layer 4 and on the connector surfaces of the components 6.

The adhesive used is thus an electrical insulator, so that electrical contacts between the contacting terminals of the component 6 do not arise in the adhesive layer 5 itself.

Stage C (FIG. 3)

In stage C, the components 6 are set in place in the electronic module. This can be done, for example, by using the aid of an assembly machine to press the components 6 into the adhesive layer 5. In the assembly stage, the through-holes 3 made for alignment, or other available alignment marks are used to align the component 6.

The components 6 can be glued singly, or in suitable groups. The typical procedure is for the conductor layer, which can be referred to as the bottom of the installation base, to be brought to a suitable position relative to the assembly machine, after which the component 6 is aligned and pressed onto the bottom of the installation base, which is held stationary during alignment and attachment.

The components 6 are preferably assembled on the installation base in such a way that the contact surfaces of their contact terminals come close to the surface of the component 6 side of the conducting layer 4 (or to vias 2 that may have been made in it). According to one embodiment, the contact terminals are assembled essentially in direct contact with the conductor layer 4.

Stage D (FIG. 4)

In stage D, a layer of adhesive 8 is spread on the upper surface of the components 6, i.e. on the surface opposite to the contacting surface of the components, or alternatively on the lower surface of the components 6' with their contact terminals set to face upwards (hereinafter, 'the second component'). The adhesive 8 used in the layer 8 is preferably the same at the adhesive 5 described in connection with stage B, or else it has the same or similar properties to this. Rapid hardening, sufficient adhesion with the surface material of the components, a thermal expansion coefficient that is of sufficiently the same magnitude as that of the component material, and preferably good electrical insulation capacity can be regarded as being the most important properties of the adhesive.

In one embodiment of the invention, it is also quite possible for a highly electrically conductive adhesive to be used, in which case the first component 6 and the second component 6' to be attached to it with the aid of adhesive at a later stage will be in electrical contact through the adhesive, generally in order to create a ground contact.

The thermal conductivity of the adhesive used is selected according to the application. With a good thermal conductivity in the adhesive, rapid transfer of heat from the component 6 will be achieved to the second component to be attached to it in a later state, or vice versa. This is advantageous in applications in which the thermal output produced by the component is wished to be transferred rapidly away from the component, in order to prevent overheating. This is particularly advantageous, if one of the components does not itself produce much heat, but can withstand the thermal load of the other component. In some cases, an adhesive with poor thermal conductivity can, on the other hand, reduce the said transfer of heat between the components. The thickness of the adhesive layer 8 can be, for example, 1-100 μm, typically 5-30 μm. By using a thin adhesive layer, a thinner base structure is achieved, but at the same time the electrical and thermal connectivity of the component is increased.

The adhesive can be brought to the surface of the component 6 or 6', for example, by brushing or dipping, but also, for example, as a drop or drops, which are spread between the components in the following stage E, when the components are pressed together against each other. The drop or drops can be brought, for example, with the aid of small nozzles. The adhesive can also be brought between the components as a spray, or with the aid of tape. The tape can also be two-sided, in which case it is left between the components and the tape with its adhesive surface forms the adhesive layer 8. Alternatively, the adhesive can be applied between the components as a film. The adhesive film preferably consists essentially entirely of the adhesive substance. In addition, it is possible to use a two-component adhesive, in which one of the adhesive components is applied to the first component and the other adhesive component is applied to the surface of the second component. When the components are pressed together, the adhesive components mix and the adhesive hardens.

In some applications the adhesive layer is not required and stage D can be omitted. This procedure can also be used if the components 6 and 6' can be attached to each other in some other way, so that they remain essentially in alignment, for example, with the aid of suitably shaping the components or of one or more support elements attached to them or placed in their vicinity.

Stage E (FIG. 5)

In stage E, a second component 6', the contact terminals of which point essentially in the opposite direction to the contact terminals of the components 6, is attached by means of an adhesive layer 8 to at least one component 6. The components 6' can be glued individually or in suitable groups. The typical procedure is for the installation base, on which the components 6 are glued, to be brought to a suitable position relative to the assembly machine and after this for the component 6' to be aligned and pressed onto the bottom of the installation base, which is held stationary during alignment and attachment. In the assembly stage, the vias 3 made for alignment, or other available alignment marks, for example, the features of the components 6, are used for alignment.

The second component 6' can be identical to the first component 6, but naturally it can also be different, either operationally or in its size or shape. If electronics modules that are intended to be attached on top of each other to form an electronic-module construction of several layers are manufactured, it may be preferable in some embodiments for the contact terminals of each pair of components 6 and 6' corresponding to each other to be next to each in the direction of the surface of the base. This will allow, at a later stage, the formation on the upper and lower surfaces of the base of simpler conductor patterns, which permit two electronic modules to be attached to each other. The components are preferably set as symmetrically as possible against each other. This achieves the advantage of saving the surface area of the installation base, for example, for making vias 23 at a later stage, which cannot be made at the locations of the components.

However, it should be noted that if the application comprises several components 6, there is no need to glue a second component 6' on top of each component 6. In addition, it is possible within the scope of the invention to also manufacture such electronic modules, in which two or more separate components 6' are brought next to each other on top of the first component 6 and correspondingly electronic modules, in which the component 6' is essentially facing several components 6 set next to each other. With the aid of the embodiments described, extremely diverse forms of electronic-module constructions can be achieved.

Stage F (FIG. 6)

In stage F, an insulating-material layer 1, in which there are ready-made holes 2 or recesses for the components 6 and 6' glued to the conductor layer 4, is placed on top of the conductor layer 4. The insulating-material layer 1 can be manufactured from a suitable polymer base, in which holes or recesses, selected according to the size and position of the components 6 and 6', are manufactured using some suitable method. The polymer base can be, for example, a pre-preg base, which is known and widely used in the circuit-board industry, which is made from a glass-fibre mat and so-called b-state epoxy. It is best to perform stage F only after the adhesive layers 5 and 8 has been cured, or otherwise hardened sufficiently for the components 6 and 6' to remain in place while the insulating-material layer 1 is set in place.

In this embodiment the insulating-material layer is thus brought to the board only once the components have been attached to each other. In this way it is possible to ensure that the components are well attached to each other and that the insulating material fills the surroundings of the components evenly. Such solutions are also known, in which the components are pressed into the insulating-material layer with the aid of heat and pressure, but in that case the components will not necessary be attached directly to each other and/or the insulating material will not fill the surroundings of the components evenly, particularly around a contact terminal. In particular, it is difficult to implement and monitor the attachment of the components to each other when using the press technique, as the insulating material surrounding the components will prevent the attachment area of the components from being watched during the attachment stage.

Figure 7:
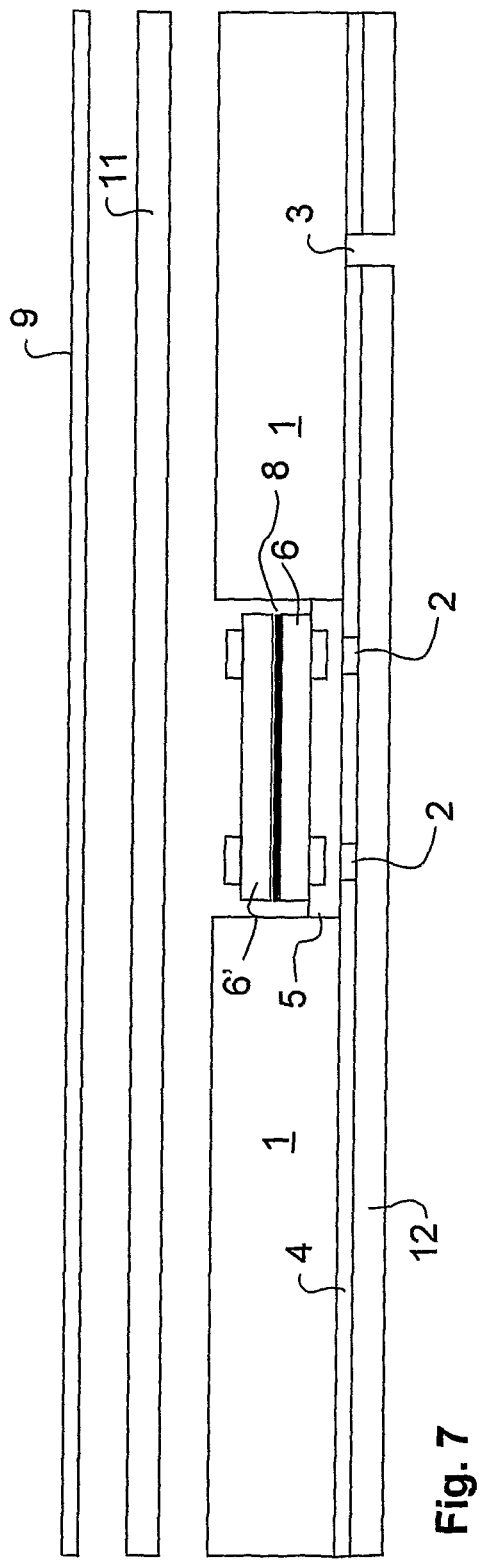

Stage G (FIG. 7)

According to one embodiment, in stage G, an unpatterned insulating-material layer 11 is set on top of the insulating-material layer 1 and then a conductor layer 9 is set on top of it. Like the insulating-material layer 1, the insulating-material layer 11 can be manufactured from a suitable polymer membrane, for example, from the aforementioned pre-preg base. The conductor layer 9 can be, for example, copper foil, or some other membrane suitable for the purpose. The conductor layer 9, like the conductor layer 4, is preferably unpatterned and uniform at this stage. The insulating material layer 11 is preferably thin, so that the distance between the contact terminals 7' and the conductor layer 9 will not become great, thus facilitating the making, at a later stage, of holes 17 through the insulating material layer and the arranged of the conductor material.

It has been found that it is particularly advantageous if the thickness of the layer remaining between the contact terminals 7 and the conductor layer 4, and the contact terminals 7' and the conductor layer 9 is less that the diameter of the holes made in it, generally being less than 50 µm, typically less than 30 µm, and even less than 20 µm. If the depth of the holes is substantially greater than their diameter, it is more difficult to manufacture holes, and thus vias, of good quality.

According to one preferred embodiment, the contact terminals 7' of the component 6' come in stage G essentially in contact with the conductor layer 9, so that the making of a good electrical contact between the contact terminals and the conductor layer 9 is further facilitated.

In some embodiments, the insulating layer 11 can be entirely omitted.

Figure 8:
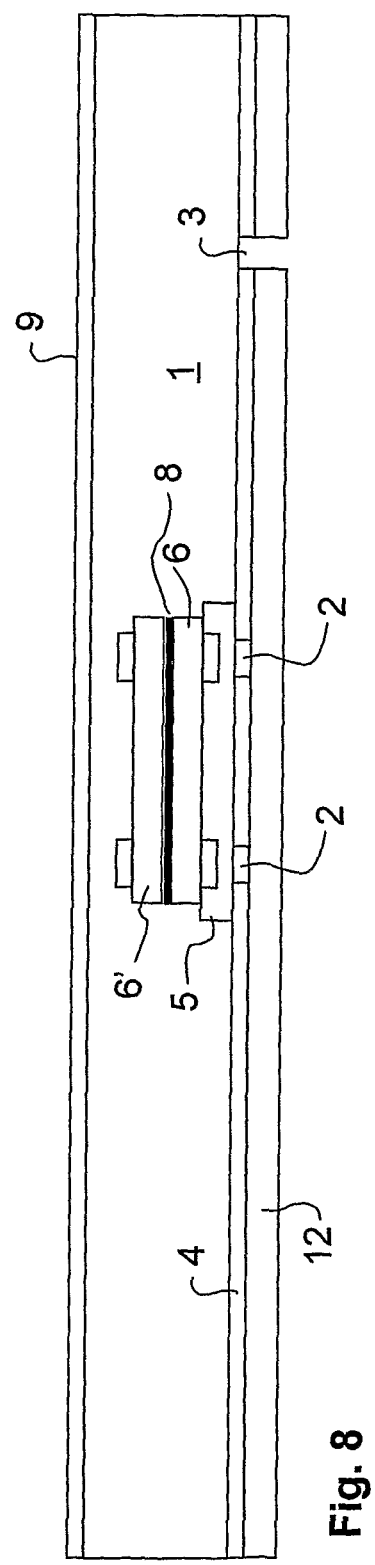

Stage H (FIG. 8)

In stage H, the layers 1 and 9, as well as the layer 11 that may possibly remain between them, are pressed with the aid of heat and pressure, in such a way that the polymer (in the layers 1 and 11) forms a unified, tight, and durable layer, which protects the components well, around the components 6 and 6' between the conductor layers 4 and 9. This procedure makes the second conductor layer 9 quite even and flat. The method can, however, also be applied to the manufacture of electronic modules that are not flat.

Figure 9:
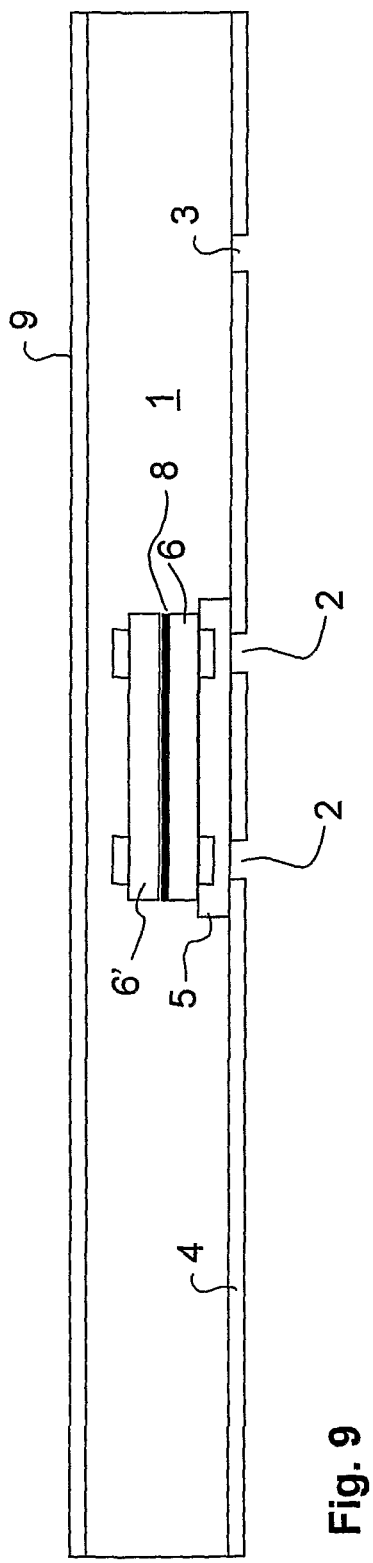

Stage I (FIG. 9)

In stage I, the support base 12 is detached or otherwise removed from the structure. The removal can take place, for example, mechanically or by etching. Naturally, stage I can be omitted in embodiments in which a support base 12 is not used. At the start of the following stages, the base is thus essentially the same on both sides.

Figure 10:
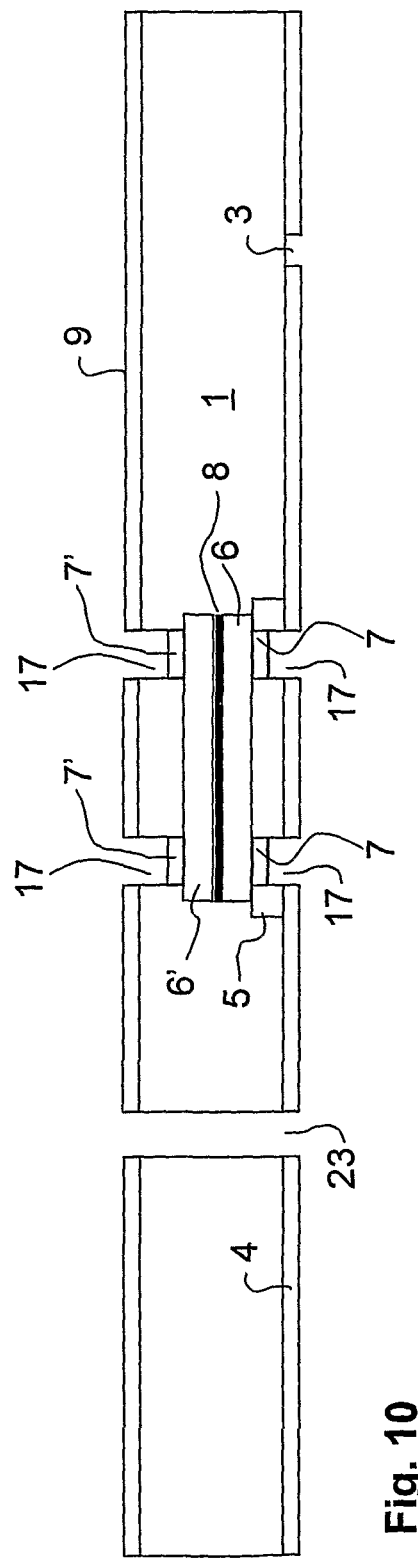

Stage J (FIG. 10)

In stage J, contacting holes 17 are made for the vias. The holes 17 are made in both sides of the base, through the conductor layers 4 and 9 and, if necessary, through the insulating-material layer 1 and/or the adhesive layer 5, in such a way as to reveal the material of the contact terminals 7 and 7' of the components 6 and 6'. The holes 17 can be made, for example, by drilling with the aid of a laser. The holes 17 can be aligned, for example, with the aid of the holes 3.

The formation of the contacts of the lower surface and the upper surfaces of the base can be implemented in practice in the same way. Thus, for the purpose of this stage, the possible adhesive layer 5 can also be regarded as being only a part of the insulating-material layer 1. If contact holes 2 have been made in the conductor layer 4 in an earlier stage, in this stage it will only be necessary to open the holes, in such a way that the contact surfaces of the contact terminals 7 are revealed. After this, the holes 2 are shown merged with the holes 17.

In order to bring the conductor layer 4 and 9 into mutual electrical contact, in stage J it is also possible to make holes 23 for the vias extending through the entire insulating material layer 1. One or more of these can be made at desired location in the base, always depending on the conductor patterning that will be implemented at a later stage. The holes 23 are preferably made like the holes 17, either with the aid of a laser, or by mechanical drilling. If an electrical connection has not been made between the oppositely set components 6 and 6' earlier in stages D and E, and it is wished to create two circuits on the same base that are not connected electrically to each other, which is entirely possible within the scope of the present invention, the making of the holes 23 can be omitted.

The holes 23 can be used in the following stages as alignment markings, in addition to the alignment holes 3 and holes 17. This is advantageous, as the holes 23 extend through the entire base structure, so that they define the relative positions of the upper and lower surfaces of the base and can be used equally well on the lower as on the upper surface of the base.

Figure 11:
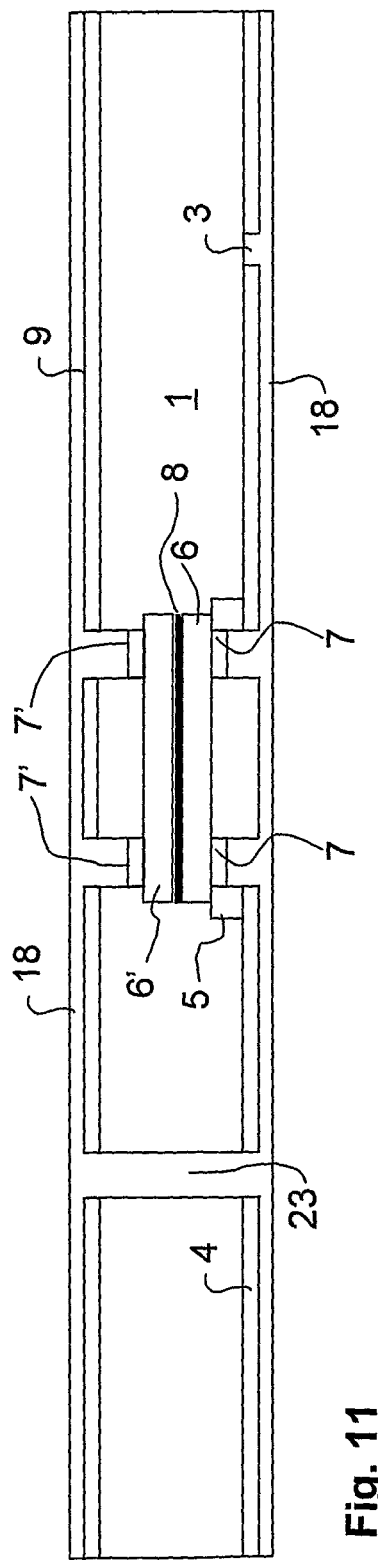

Stage K (FIG. 11)

In stage K, conductor material 18 is grown in the holes 17 and possible holes 23 made in stage J, in order to create vias. In the example process, the conductor material is grown at the same time also elsewhere on top of the base, thus increasing the thickness of the conductive layers 4 and 9 too.

The conductor material 18 to be grown can be, for example, copper, or some other sufficiently electrically conductive material. The selection of the conductor material 18 takes into account the ability of the material to form an electrical contact with the material of the contact protrusions 7 and 7' of the components 6 and 6'. In one example process, the conductor material 18 is mainly copper. The copper metallizing can be performed by depositing a thin layer of chemical copper in the holes 17 and 23 and then continuing plating using an electrochemical copper-growing method. Chemical copper is used, for example, because it will also form a deposit on top of the adhesive and act as an electrical conductor in electrochemical plating. The metal can thus be grown using a wet-chemical method, so that the growing is cheap.

In the example process, the vias 17 and 23 are first of all cleaned using a three-stage desmear process. After this, the vias are metallized, in such a way that first a polymer catalyzing SnPd coating is formed, after which a thin layer (about 2 μm) of chemical copper is deposited on the surface. The thickness of the copper is increased by electrochemical deposition.

By stage K, it is intended to form an electrical contact between the components 6 and 6' and the conductor layers 4 and correspondingly 9 and possibly directly between the conductor layers 4 and 9. Thus, in stage K it is not essential to increase the thickness of the conductor layers 4 and 9, but instead the process can equally well be designed so that in stage K the holes 17 and 23 are only filled. The conductor layer 18 can be manufactured, for example, by filling the holes 17 and 23 with an electrically conductive paste, or by using some other suitable microvia metallizing method.

The end result of the example process is a product, in which the holes 17 are in the depth direction and radially essentially entirely filled with conductive material. This achieves reliable and durable contacts, nor will any other filler like a polymer or adhesive substance need to be arranged in the holes, as is necessary, for example, when using wire bonding.

In the later figures, the conductor layer 18 is shown merged with the conductor layers 4 and 9.

Figure 12:
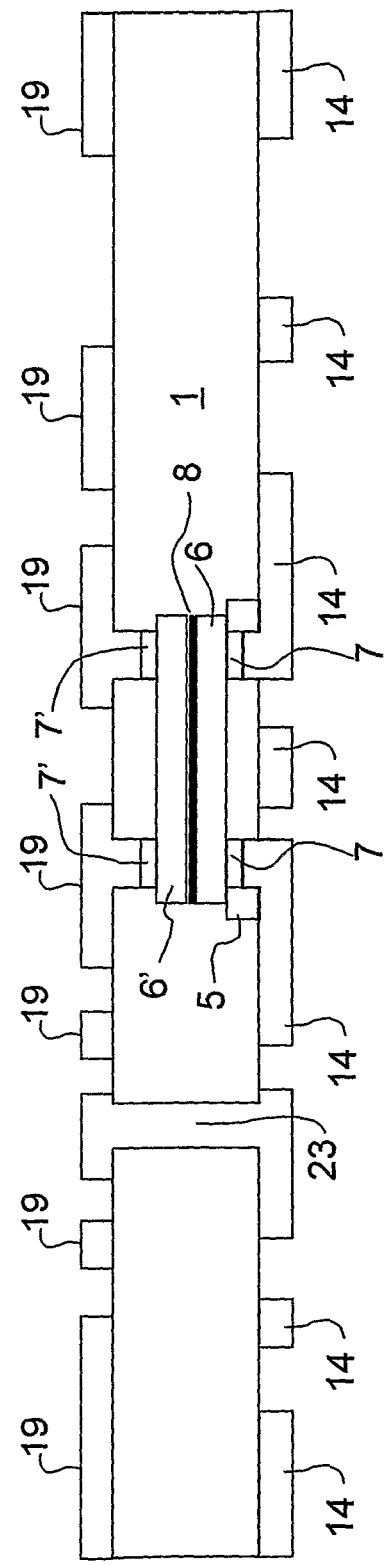

Stage L (FIG. 12)

In stage L, the desired conductor patterns 14 and 19 are made from the conductor layers 4 and 9 on the surfaces of the base. The conductor patterns 14 and 19 can be made by removing the conductor material of the conductor layer 4 and 9 from outside the conductor patterns. The conductor material can be removed, for example, using some of the patterning and etching methods that are widely used and well known in the circuit-board industry, for example, by etching.

After stage L, the electronics module includes the components 6 and 6', or several components 6 and 6', conductor patterns 14 and 19, and possible electrical vias 23. With the aid of the conductor patterns 14 and 19 and the vias 23, the components 6 and 6' can be connected to an external circuit, or to each other. The preconditions then exist for manufacturing an operational totality. The process can thus be designed in such a way that the electronic module is ready after stage L and FIG. 12 indeed shows an example of one possible electronic module consisting of two component layers.

If desired, the process can also continue after stage L, for example, by coating the electronic module with a protective agent, or by manufacturing additional conductor pattern layers on the first and/or second surface of the electronic module. It is also possible to stack several such electronic modules and thus form modules with several layers, as is described, for example in the same applicant's earlier publications WO 03/065778 and WO 03/065779. Sub-modules of the multi-layer electronic module (the bases 1 with their components 6 and 6' and conductors 14 and 19) can be manufactured, for example, using one of the electronic-module manufacturing methods described above. Some, or all of the sub-modules to be attached to the layered structure can, of course, be manufactured equally well using some other method suitable for the purpose.

In the present invention, it is possible to use components, for example microcircuits, the thickness of which is, for example, less than 150 μm and even less than 50 μm. The invention can thus be used to manufacture operational circuit board comprising two component layers, or electronic modules, the thickness of which together with the conductor layer is, for example, 120-400 μm. The distance between the conductor patterns is typically 50-250 μm while the diameter of the vias is typically 20-100 μm.

According to one preferred embodiment, essentially the same conductor patterns can be made on both surface of the module, so that two or more such modules can be placed on top of each other so that their conductor patterns lie next to each other. The contact patterns can consist of conductor structures 14 and 19 arranged directly on top of the insulating material or they can be manufactured as separate layers on top of them. The advantage of this embodiment is that some method known in the field can be used to form electrical contact between the contact patterns. In the manner described, it is then possible to manufacture electronic modules, the operationally of which is improved by increasing their dimension by layering in the direction at right angles to the surface of the base. The electronic modules that are placed on top of each other can even be very different operationally. Externally too they need not be completely similar, instead one or more of the components smaller units, the contact patterns of which coincide with the contact pattern of a large base at some specific point in the base, can be connected on top of the larger base.

The examples of FIGS. 1-12 show some possible processes, with the aid of which our invention can be exploited. However, our invention is not restricted only to the processes described above, but instead the invention also covers other various processes and their end products, taking into account the full scope and equivalence interpretation of the Claims. The invention is also not restricted to only the constructions and methods shown by the examples, but instead it will be obvious to one versed in the art that the various applications of our invention can be used to manufacture very many different kinds of electronic modules and circuit-boards, which differ even greatly from the examples described above. The components and circuits of the figures are thus shown only for the purpose of illustration. Thus many alterations can be made to the processes of the examples described above, without, however, deviating from the basic idea according to the invention. The changes can relate, for example, to the manufacturing techniques described in the different stages, or to the mutual order of the process stages.

Our invention can thus also be applied in connection with very many different kinds of known manufacturing methods. For example, in the solutions disclosed in publications WO 03/065778 and WO 03/065779, in which the holes for the embedding of the components are made beforehand in the insulating material layer, the second component would be brought on top of the first component after the stage 1G described in the publications referred to. Similarly, the characteristic features of the method disclosed in the publication WO 04/089048, for example, can be applied to the present invention.

In addition, the invention can also be applied in connection with the method and electronic modules disclosed in the same applicant's international patent applications, which are still unpublished at the moment of making the present application. For example, the method disclosed in our application PCT/FI2005/000199, together with its various embodiments, for conducting heat away from an embedded component can be easily and effectively applied to the electronic module and its manufacturing method according to the present invention. In the solution, thermal vias are formed in the base in the vicinity of the components, through which the heat is conducted away from the components. When applying this method to the present invention, it is also possible to allow for the transfer of heat between components set opposite each other. Also, for example, the method disclosed in the publication WO 04/077902, in which thermal bumps are made on top of the conductor layer in the areas between the contact areas, can be applied to a construction, according to the present invention, comprising two component layers. It is possible to proceed correspondingly also in connection with the technique disclosed in the application WO 04/077903.

The invention claimed is:

1. An electronics module, comprising:
an insulating material layer having two opposite surfaces,
embedded in the insulating material layer, at least one first embedded component having first contact terminals which face essentially towards the first surface of the insulating material layer and being connected electrically from its contact terminals to first conductor structures contained on the first surface of the insulating material layer,
embedded in the insulating material layer, a second embedded component essentially aligned with the first embedded component and having second contact terminals which face essentially towards the second surface of the insulating material layer and being connected electrically from its contact terminals to second conductor structures contained on second surface of the insulating material layer,
wherein
the insulating material layer is a unified layer consisting of essentially the same material between said first and second conductor structures,
the first and second contact terminals are connected to the first and second conductor structures through first microvias manufactured to the insulating material layer, the depth of the microvias being less than their diameter,
the first and second conductor structures are connected to each other through second microvias manufactured through the insulating material layer,
the first and second microvias and the conductor structures comprise a unitary metal structure electrically connecting the first and second conductor structures to each other and to the components,
said unitary metal structure extends from at least one of the first microvias connected to at least one of the first contact terminals, through the first conductor structure, at least one of the second microvias and the second conductor structure, to at least one of the first microvias connected to at least one of the second contact terminals, and
the first component and the second component are directly attached to each other by means of a local adhesive layer or two-sided tape applied between the components.

2. The electronics module according to claim 1, wherein the adhesive or two-sided tape is electrically insulating.

3. The electronics module according to claim 1, wherein the insulating material layer is formed by hardening from at least one unhardened and/or pre-hardened polymer-containing material layer.

4. The electronics module according to claim 1, wherein several second components are attached to the at least one first component.

5. The electronics module according to claim 1, wherein the first and second conductor structures are connected electrically to each other through vias, in order to form an operational totality.

6. The electronics module according to claim 5, wherein the first and second conductor structures consist of one or more patterned conductor layers arranged on top of each other on the surface of the insulating material layer.

7. The electronics module according to claim 1, wherein metallizations fill the microvias in the insulating material layer at the locations of the contact terminals essentially entirely.

8. The electronics module according to claim 1, wherein the thickness of the adhesive or two-sided tape is 1-100 μm.

9. The electronics module according to claim 8, wherein the thickness of the adhesive or two-sided tape is 5-30 μm.

10. The electronics module according to claim 1, wherein the depth of the microvias is less than 50 μm.

11. A method for manufacturing an electronics module, comprising:

providing a unified insulating material layer consisting of essentially the same material and comprising two opposite surfaces, embedding at least one first component having first contact terminals to the insulating material layer, the first contact terminals facing towards the first surface of the insulating material layer, attaching a second component to said first component using a local glue layer or two-sided tape applied between the first and second components, the second component having second contact terminals facing towards the second surface of the insulating material layer, providing a first conductor structure on the first surface of the insulating material layer, providing second conductor structures on the second surface of the insulating material layer, manufacturing contacts for connecting the first component electrically from the first contact terminals to the first conductor structures and for connecting the second component electrically from the second contact terminals to the second conductor structures, wherein said contacts are manufactured by:

making first microvias to the insulating material layer at the locations of the first and second contact terminals, the depth of the microvias being less than their diameter, making second microvias through the insulating material layer, depositing a layer of chemical metal into the first and second microvias, and electrochemically growing the same metal onto the insulating material layer and into the chemical metal-deposited first and second microvias in order to form a unitary metallization to the microvias and to the conductor structures, said unitary metal structure extending from at least one of the first microvias connected to one of the first contact terminals, through the first conductor structure, at least one of the second microvias and the second conductor structure, to at least one of the first microvias connected to at least one of the second contact terminals.

12. The method according to claim 11, wherein at least part of the insulating material layer is brought to the electronic modules after the attaching the first component and the second component together.

13. The method according to claim 11 or 12, wherein the insulating material layer is formed of at least two separate material sheets, which are pressed to form a single unified insulating material layer.

14. The method according to claim 11, wherein several second components are attached to the at least one first component.

15. The method according to claim 11, wherein the microvias are manufactured by making holes through the first and second conductor structures arranged on the first and second surfaces of the insulating material layer, respectively, to the level of the surface of the first and second contact terminals, respectively, and by filling the holes essentially entirely with metal.

16. The method according to claim 11, comprising:

providing a first conductor layer, providing a first component, which has a contacting surface having the first contact terminals, and a surface opposite to the contacting surface, the first component is attached using adhesive from its contacting surface to a first surface of the conductor layer, providing a second component, which has a contacting surface having the second contact terminals, and a surface opposite to the contacting surface, the second component is attached using adhesive on top of the first component, in such a way that their surfaces opposite to the contacting surfaces are facing each other, providing an insulating material layer surrounding the first and second components on the first surface of the first conductor layer and a second conductor layer is provided on a free surface of the insulating material layer, microvias for connecting the first contact terminals of the first component electrically to the first conductor layer and for connecting the second contact terminals of the second component electrically to the second conductor layer are formed, as well as a necessary number of vias for connecting the conductor layers electrically to each other, and making conductor patterns from the conductor layers.

17. The method according to claim 11, wherein adhesive or two-sided tape having the thickness of 1-100 μm is used.

18. The method according to claim 17, wherein adhesive or two-sided tape having the thickness of 5-30 μm is used.

19. The method according to claim 18, wherein adhesive is used for attaching the components, the adhesive being applied by brushing, dipping or spraying.

20. The method according to claim 11, wherein the depth of the microvias is less than 50 μm.

21. The method according to claim 11, wherein metal is grown simultaneously to the microvias and to the first or second conductor structures, whereby the microvias are filled with metal and the thickness of the conductor structures is increased.

* * * * *